(12) United States Patent
Avila et al.

(10) Patent No.: US 8,132,045 B2
(45) Date of Patent: Mar. 6, 2012

(54) PROGRAM FAILURE HANDLING IN NONVOLATILE MEMORY

(75) Inventors: Chris Nga Yee Avila, Sunnyvale, CA (US); Jonathan Hsu, Newark, CA (US); Alexander Kwok-Tung Mak, Los Altos Hills, CA (US); Jian Chen, Menlo Park, CA (US); Grishma Shailesh Shah, San Jose, CA (US)

(73) Assignee: SanDisk Technologies, Inc., Plano, TX (US)

( * ) Notice: Subject to any disclaimer, the term of this patent is extended or adjusted under 35 U.S.C. 154(b) by 111 days.

(21) Appl. No.: 12/485,827

(22) Filed: Jun. 16, 2009

(65) Prior Publication Data

US 2010/0318721 A1    Dec. 16, 2010

(51) Int. Cl.
    *G06F 11/00* (2006.01)
(52) U.S. Cl. ........ 714/6.21; 711/103; 711/118; 714/5.1; 714/6.1; 714/6.11; 714/6.2; 714/42
(58) Field of Classification Search ......... 714/5, 7, 714/8, 42, 5.1, 6.1, 6.11, 6.2, 6.21; 711/103, 711/118
See application file for complete search history.

(56) References Cited

U.S. PATENT DOCUMENTS

| | | | |
|---|---|---|---|
| 5,838,894 A * | 11/1998 | Horst | 714/11 |
| 6,266,273 B1 | 7/2001 | Conley et al. | |
| 7,120,051 B2 | 10/2006 | Gorobets et al. | |
| 7,158,421 B2 | 1/2007 | Li et al. | |
| 7,409,473 B2 | 8/2008 | Conley et al. | |
| 7,447,078 B2 | 11/2008 | Li | |
| 7,463,521 B2 | 12/2008 | Li | |
| 7,475,174 B2 * | 1/2009 | Chow et al. | 710/74 |
| 7,480,181 B2 | 1/2009 | Li | |
| 7,490,283 B2 | 2/2009 | Gorobets et al. | |
| 7,502,260 B2 | 3/2009 | Li et al. | |
| 7,505,320 B2 | 3/2009 | Li | |
| 7,761,740 B2 * | 7/2010 | Kern et al. | 714/15 |
| 7,873,778 B2 * | 1/2011 | Choi et al. | 711/103 |
| 2004/0188710 A1 | 9/2004 | Koren et al. | |
| 2005/0141312 A1 | 6/2005 | Sinclair et al. | |
| 2005/0204187 A1 * | 9/2005 | Lee et al. | 714/8 |
| 2006/0031593 A1 | 2/2006 | Sinclair | |
| 2006/0136656 A1 | 6/2006 | Conley et al. | |
| 2006/0184720 A1 | 8/2006 | Sinclair et al. | |
| 2006/0198202 A1 | 9/2006 | Erez | |
| 2007/0101096 A1 | 5/2007 | Gorobets | |
| 2007/0140036 A1 | 6/2007 | Noguchi et al. | |
| 2008/0016269 A1 * | 1/2008 | Chow et al. | 711/103 |
| 2008/0316816 A1 | 12/2008 | Lin | |
| 2009/0276474 A1 * | 11/2009 | Sela et al. | 707/204 |
| 2010/0030951 A1 * | 2/2010 | Kim | 711/103 |

OTHER PUBLICATIONS

Cardinal Search Report, "2001.21 Lower Page Program Failure Handling with Internal Memory Latch XDL," prepared Jan. 21, 2009. Cardinal Intellectual Property, Inc.

* cited by examiner

*Primary Examiner* — Charles Ehne
(74) *Attorney, Agent, or Firm* — Weaver Austin Villeneuve & Sampson LLP

(57) ABSTRACT

In a nonvolatile memory system, data received from a host by a memory controller is transferred to an on-chip cache, and new data from the host displaces the previous data before it is written to the nonvolatile memory array. A safe copy is maintained in on-chip cache so that if a program failure occurs, the data can be recovered and written to an alternative location in the nonvolatile memory array.

17 Claims, 5 Drawing Sheets ns and
methods of operating nonvolatile memory systems. In particular, this application relates to handling of program failure in nonvolatile memory.

PROGRAM FAILURE HANDLING IN NONVOLATILE MEMORY

BACKGROUND OF THE INVENTION

This invention relates to nonvolatile memory systems and methods of operating nonvolatile memory systems. In particular, this application relates to handling of program failure in nonvolatile memory.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Different types of flash memory array architecture are used in nonvolatile memory systems. In one type of architecture, a NAND array, strings of more than two memory cells, such as 16 or 32, are connected along with one or more select transistors between individual bit lines and a reference potential to form columns of cells. Word lines extend across cells within a large number of these columns.

An individual flash memory cell may hold one bit of data in what is known as a Single Level Cell (SLC) memory. In some examples, a memory cell may hold two or more bits of data in what is known as a Multi Level Cell (MLC) memory.

When data is written to a nonvolatile memory array, a program failure may occur because of a physical defect in the memory array, or for some other reason. Dealing with such program failures, especially in MLC memory systems, can be problematic and some approaches are costly because they use a lot of controller resources.

SUMMARY

A nonvolatile memory system according to an embodiment includes an on-chip cache that holds data prior to programming the data to a nonvolatile memory array. A controller receives data from a host and sends the data to the on-chip cache, where a safe copy of the data is maintained until it is successfully written to the nonvolatile memory array. If a write failure occurs, the safe copy is used to recover the data and write it to another location in the nonvolatile memory. Keeping a safe copy in on-chip cache means that the controller does not have to maintain a safe copy and so controller RAM may be smaller than if it had to maintain a safe copy. The controller can also start receiving new data sooner from the host because controller RAM is available once the previous data is transferred to on-chip cache.

A method of recovering data to be written to a buffered memory array that stores one or more bits per cell under the control of a memory controller according to an embodiment comprises: maintaining a safe copy of the data in an on-chip cache until writing of a target copy of the data to the memory array is confirmed as successful; and when the writing of the data is unsuccessful, then recovering the data from the safe copy in the on-chip cache and writing the data to an alternative location in the memory array.

In an example, no copy of the data is maintained in the memory controller during the writing of the target copy of the data. The data may be recovered from the on-chip cache and the data may be written to the alternative location without a separate write command from the host. Alternatively, the data may be recovered from the on-chip cache and the data may be written to the alternative location in response to a command from the host.

A method of managing data transfer from a host to a buffered non-volatile memory array that stores more than one bit per cell according to an embodiment comprises: copying a first portion of data from a memory controller to an on-chip cache; subsequently writing the first portion of data from the on-chip cache as lower-page data in the memory array; in parallel with writing the first portion of data, maintaining the first portion of data in the on-chip cache, and replacing the first portion of data in the memory controller; subsequently copying a second portion of data from the memory controller to the on-chip cache, after writing the first portion of data; subsequently writing the second portion of data from the on-chip cache as upper-page data in the memory array; and in parallel with writing the second portion of data, maintaining the second portion of data in the memory controller.

During the writing of the first portion of data, a busy signal may be provided to the memory controller to indicate that the non-volatile memory array is busy. During the writing of the first portion of data, additional data may be received from the host, the additional data replacing the first portion of data in the memory controller. The first portion of data and the second portion of data may be written to the same cells, with an individual cell containing one bit from the first portion of data and one bit from the second portion of data. The first portion of data may be written to a first location in the memory array and the method may further comprise: detecting if the writing of the first portion of data to the first location is successful or unsuccessful and if unsuccessful then writing the first portion of data from the on-chip cache to an alternative storage area. The first portion of data may be written to the alternative storage area without being copied to the memory controller. Writing the first portion of data from the on-chip cache to the alternative storage area may include copying the first portion of data from the on-chip cache to the memory controller and then copying the first portion of data to the alternative storage. The method may also comprise: prior to copying the first portion of data from the on-chip cache to the memory controller, copying any data in the memory controller to the memory array. The second portion of data may be written to a second location in the memory array and the method may further comprise: detecting if the writing of the second portion of data to the second location is successful or unsuccessful and if unsuccessful then copying the second portion of data from the memory controller to an alternative storage area.

A memory system according to an embodiment comprises: a memory controller; a non-volatile memory array; and an on-chip cache interposed between the memory controller and the non-volatile memory array, wherein only the on-chip cache maintains bits to be written to the memory array until they are confirmed as successfully written, and when bits are not successfully written, the on-chip cache providing a copy of the bits for recovery.

The bits to be written may be lower-page bits, and the memory controller may have insufficient capacity to store data to be written to a lower-page and store data to be written to an upper page at the same time. The memory controller may be configured to receive new data that displaces lower-page data in the memory controller, after the lower-page data is copied to the on-chip cache, and before the lower-page data is written to the memory array. The memory controller may be configured to maintain a busy signal and maintain upper-page data in the memory controller for the entire time period from the time the upper-page data is copied to the on-chip cache to the time the upper-page data is successfully written to the memory array.

DETAILED DESCRIPTION OF ILLUSTRATED EMBODIMENTS

Figure 1:
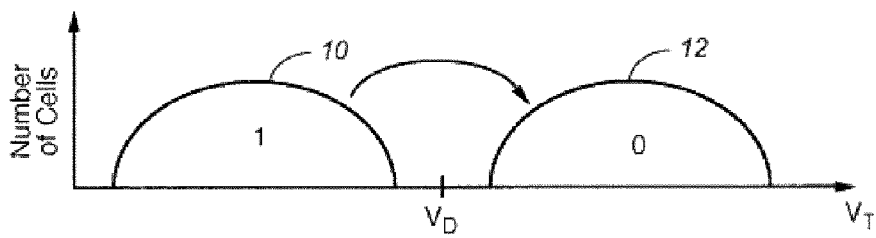
FIG. 1 shows programming of an SLC memory.

It is common in current commercial products for each storage element of a flash EEPROM array to store a single bit of data by operating in a binary mode, where two ranges of threshold voltage of the storage element transistors are defined as two memory states. The threshold voltages of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold voltage levels as memory states for each storage element transistor, four such states (2 bits of data per storage element) being used in one example. More storage states, such as 16 states (4 data bits) per storage element may also be used. Each storage element memory transistor has a certain total range (window) of threshold voltages in which it may practically be operated, and that range is divided into the number of states defined for it plus margins between the states to allow for them to be clearly differentiated from one another.

As the number of states stored in each memory cell increases, the tolerance of any shifts in the programmed charge level on the storage elements decreases. Since the ranges of charge designated for each memory state must necessarily be made narrower and placed closer together as the number of states stored on each memory cell storage element increases, the programming (or writing, the terms are used interchangeably in the present application) must be performed with an increased degree of precision and the extent of any post-programming shifts in the stored charge levels that can be tolerated, either actual or apparent shifts, is reduced. Actual disturbs to the charge stored in one cell can be created when programming and reading that cell, and when reading, programming and erasing other cells that have some degree of electrical coupling with that cell, such as those in the same column or row, and those sharing a line or node.

Apparent shifts in the stored charge levels occur because of field coupling between storage elements. The degree of this coupling is necessarily increasing as the spaces between memory cell storage elements are being decreased, which is occurring as the result of improvements of integrated circuit manufacturing techniques. The problem occurs most pronouncedly between two groups of adjacent cells that have been programmed at different times. One group of cells is programmed to add a level of charge to their storage elements that corresponds to one set of data. After the second group of cells is programmed with a second set of data, the charge levels read from the storage elements of the first group of cells often appear to be different than programmed because of the effect of the charge on the second group of storage elements being capacitively coupled with the first. This is known as the Yupin effect, and is described in U.S. Pat. No. 5,867,429. This patent describes either physically isolating the two groups of storage elements from each other, or taking into account the effect of the charge on the second group of storage elements when reading that of the first group. Various programming schemes may be used to reduce Yupin effect. In particular, programming of MLC memory may be done in stages, a first stage is performed to bring a group of memory cells close to their desired charge levels. Then, only after neighboring cells have undergone at least a first stage, a second stage is performed to bring the cells to their desired levels. Thus, the final charge levels reflect changes caused by programming of neighboring cells.

Because of the higher precision required in programming MLC memory, more time is generally needed than for programming SLC memory. Also, programming in multiple steps to reduce apparent shifts in charge levels may take more time. This means that MLC storage, though more efficient in using space in a memory array, may be slower than SLC memory, at least for programming. In order to take advantage of the storage efficiency of MLC memory and the speed of SLC memory, data may initially be written to SLC memory and later copied to MLC memory. Once all data from an SLC block is copied to an MLC block, the SLC block may be erased so that it becomes available for subsequent use.

FIG. 1 shows programming of a SLC memory. The threshold voltage ($V_T$) of a cell is mapped to two distinct ranges representing two memory states and threshold voltages of individual cells are represented by distributions 10, 12 shown for logical state 1 and logical state 0 respectively. An erased memory cell represents a logic 1 state. A programmed cell represents a logic 0 state. Generally, memory cells are erased together in a unit of a block (erase block) so that all cells in the block are brought to the logic 1 state together. Cells are generally programmed together in units of a page, where a block consists of one or more pages. In one example, a NAND flash memory consists of blocks of cells, with each block consisting of multiple pages that are formed by rows of memory cells. Examples of NAND flash memory systems and their operation are provided in U.S. Pat. No. 7,061,798. During programming, cells that are to hold a logical 0 have their threshold voltage increased as shown, while cells that are to hold a logical 1 remain at their erased threshold voltage. Programming may include a series of pulse and verify steps. Once the cells are programmed, the state of a cell is read by comparing the threshold voltage of the cell to a discrimination voltage ($V_D$). Thus, any cell having a threshold voltage less than $V_D$ is read as storing a 1, and any cell having a threshold voltage greater than $V_D$ is read as storing a 0.

Figure 2A:
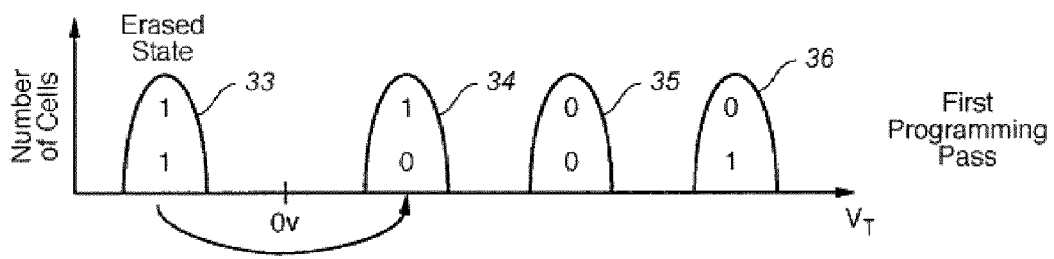
FIG. 2A shows a first stage of programming an MLC memory.

FIG. 2A shows a first stage of programming MLC memory. In particular, FIG. 2A shows the threshold voltage of a cell having four different threshold voltage ranges assigned to four different memory states 33-36. The erased state 33 has the lowest threshold voltage range, indicated by a threshold voltage less than 0 volts in this example. The first programming stage of FIG. 2A programs some cells to the next state, state 34 and leaves others in erased state 33. This programming stage (first pass) generally programs cells of a page of memory together and the bits programmed in this way may be considered as a logical page (lower page). Thus, after the first pass programming of FIG. 2A a first logical page has been programmed and all cells of the physical page in the memory array are either in the erased state 33 or first programmed state 34. Programming may be achieved by a series of programming pulses with verification performed between pulses.

Figure 2B:
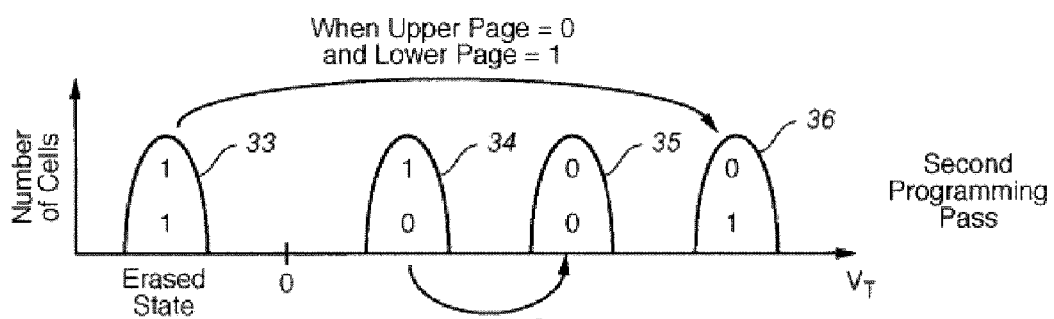
FIG. 2B shows a subsequent second stage of programming the MLC memory of FIG. 2A.

FIG. 2B shows a second programming stage (second pass) that is performed subsequent to the first stage of FIG. 2A. In this stage, cells are programmed according to bits of a second logical page (upper page). For cells storing a 1 in the upper page, the memory state remains in erased state 33 or first programmed state 34. For cells storing a 0 in the upper page, the memory state is programmed to second programmed state 35 or third programmed state 36 as shown. Cells in erased state 33 are programmed to third programmed state 36 and cells in first programmed state 34 are programmed to second programmed state 35 as shown. Thus, after the second programming stage, a cell may be in any one of four possible memory states as determined by an upper page bit and a lower page bit as indicated by bits shown in distributions of cells in states 33-36. It will be understood that FIGS. 2A and 2B show an exemplary scheme and other schemes may also be used to program MLC memory.

While storing larger amounts of data per unit area in a memory array is achievable using MLC as compared with SLC, reducing the speed of programming is generally not desirable and may not be acceptable for certain applications. In particular, for removable mass storage applications (e.g. in flash memory cards or USB flash drives), hosts may require data to be stored within a specified maximum time. In order to take advantage of the storage efficiency of MLC without suffering a time penalty, data may initially be stored in SLC and later stored in MLC at a time when resources are available, e.g. data may be moved to MLC as a background operation. When the data is stored in SLC, an indication may be sent to the host indicating that the data is stored. Thus, the host sees data storage taking place at the speed of SLC storage. Subsequent storage in MLC may be transparent to the host.

As long as transfer of data from SLC memory to MLC memory takes place in a timely manner, the extra space occupied by data in SLC memory may not have a significant impact.

Many memory chips have some form of latches or registers that hold data prior to, or during, programming of data to the memory array. Such latches may be used as an on-chip cache to provide faster transfer of data. Examples of such on-chip cache are provided in US Patent Application Publication No. 2006/0136656, which is hereby incorporated by reference for all purposes. Additional examples of how data latches may be used for caching data on a memory chip are provided in U.S. Pat. No. 7,505,320, which is hereby incorporated by reference for all purposes.

Figure 3:
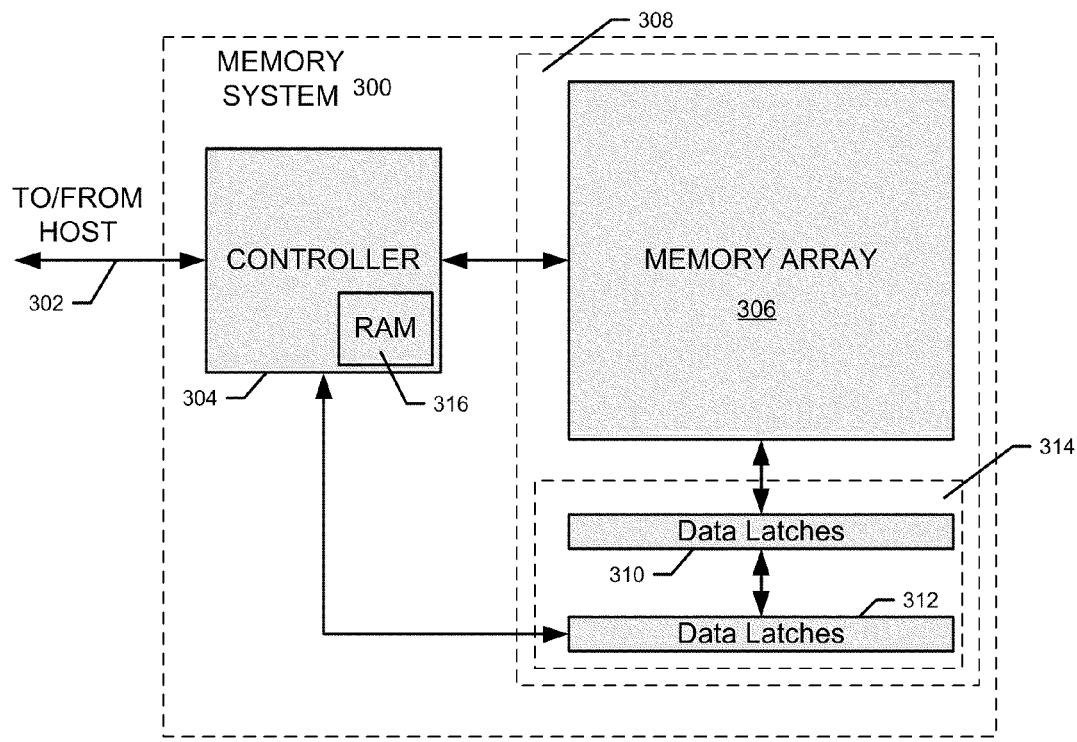
FIG. 3 shows an example of a memory system in communication with a host.

FIG. 3 shows an example of a memory system 300 that may be embodied in a memory card, USB flash drive, or other removable nonvolatile memory system. FIG. 3 shows communication to and from a host, which generally occurs through a standardized interface 302. Such an interface is generally established by a standard that dictates the physical arrangement of contacts and the details of how communication is to occur between the host and memory system. The memory system 300 includes a controller 304 that manages communication with the host and also manages how data is stored in the memory array 306. In a typical arrangement, the memory controller determines where particular data is stored in the memory array and maintains a logical-to-physical mapping that relates logical addresses provided by the host to physical addresses in the memory array. FIG. 3 shows the controller 304 on a separate chip to the memory array 306, though in some examples, the controller may be on the same chip as the memory array. The memory chip 308 includes two sets of data latches 310, 312 that may be considered together as an on-chip cache 314. "On-chip" here indicates that the data latches are on the same chip as the memory array, and the data latches may be considered as peripheral circuits on the memory chip 308. The on-chip cache may also be considered to be a buffer for the memory array 306, and a memory array having such a buffer may be referred to as a buffered memory array. Data latches 310, 312 are connected to bit lines so that the data to be written to a page is stored in a set of data latches which form a page buffer. Thus, the sets of data latches shown form two page buffers 310, 312, each of which contains data to be written to one page of the memory array 306. In some examples, data for a lower page may be held in one page buffer while data for an upper page is held in another page buffer. The controller 304 also includes a volatile memory (controller RAM 316) which may be used to store data from the host prior to storing it in the memory array.

In a typical arrangement, the memory array is programmed in a unit called a page which extends along a word line. In such an arrangement, a page forms the minimum unit of programming. Because each cell holds more than one bit, a word line holds more than one page. For example, where cells of a word line each store two bits of data, the word line stores two pages of data, commonly referred to as lower-page and upper-page data as shown previously. A page may be programmed once with data. However, if the page is subsequently programmed with additional data (without first erasing the original data) the original data may be corrupted by the subsequent programming. Because of the risk of such corruption, a memory array may be operated so that once a page is written, subsequent writing to that page is prohibited even if the page is not full. Dummy data may be used to fill up the unused portion of such a page.

Memory cells of a typical flash EEPROM array are divided into discrete blocks of cells that are erased together. That is, the block is the erase unit, a minimum number of cells that are simultaneously erasable. Each block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the block in which they are stored. Such memories are typically configured with 16, 32 or more pages within each block, and each page stores one or just a few host sectors of data.

In order to increase the degree of parallelism, and thus improve performance, during programming user data into the memory array and reading user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, blocks may be linked together to form virtual blocks or metablocks. That is, each metablock is defined to include one block from each plane. Use of the metablock is described in U.S. Pat. No. 6,763,424, which patent, is hereby incorporated by reference in its entirety, for all purposes. The metablock is identified by a host logical block address as a destination for programming and reading data. Similarly, all blocks of a metablock are erased together. The controller in a memory system operated with such large blocks and/or metablocks performs a number of functions including the translation between logical block addresses (LBAs) received from a host, and physical block numbers (PBNs) within the memory cell array. Individual pages within the blocks are typically identified by offsets within the block address. Address translation often involves use of intermediate terms of a logical block number (LBN) and logical page.

Figure 4:
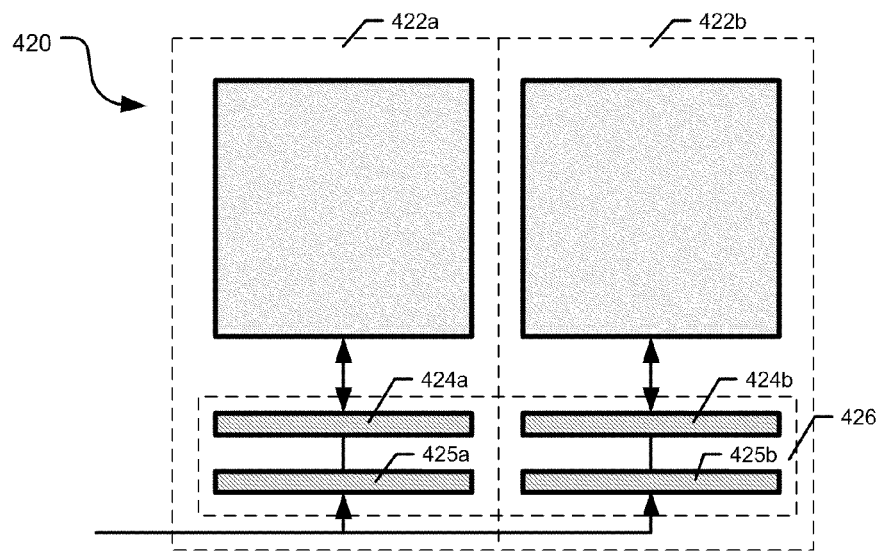
FIG. 4 shows an example of a memory chip having two planes.

FIG. 4 shows a memory array 420 that is formed as two planes 422a, 422b, each having an array portion and an on-chip cache portion. A metablock extends across both planes and consists of one block in each plane. A metapage also extends across both planes. The present application uses the term "page" to refer to the unit of programming of the memory array, which may be a page of a single plane (sometimes referred to as a "die-page") where one page is programmed at a time, or a meta-page that extends across multiple planes where planes are programmed in parallel. Thus, the term page buffer may refer to the data latches that hold data to be programmed to a meta-page rather than just the data latches that hold data for the portion of the meta-page in a single plane. The page buffers connected to a particular memory array, located on the same chip as the memory array, form an on-chip cache. Data latches 424a, 424b form a page buffer in FIG. 4 because data latches 424a, 424b together hold all the data for a page that extends across both planes. Data latches 424a, 424b, 425a, and 425b together form on-chip cache 426. In general, techniques described here with respect to a page will be understood to apply equally to a single die-page within a plane, or to a page (metapage) that extends across two or more planes of a memory array.

Problems may arise in memory systems where there is a failure to write data to the nonvolatile memory. In a typical arrangement, data is sent by a memory controller to a memory chip, where the data is written from a set of data latches (a page buffer) to the nonvolatile memory. However, if there is some error during the writing operation, the copy of the data in the data latches (the target copy) will not generally be recoverable and no complete copy of the data exists in nonvolatile memory (since an error has occurred which prevented it from being written there). In some memory systems, a safe (backup) copy of the data is maintained in the controller RAM until the data is confirmed as written. Then, after the data is confirmed as written, the next data is received from the host, displacing the backup copy in the controller RAM.

Figure 5A:
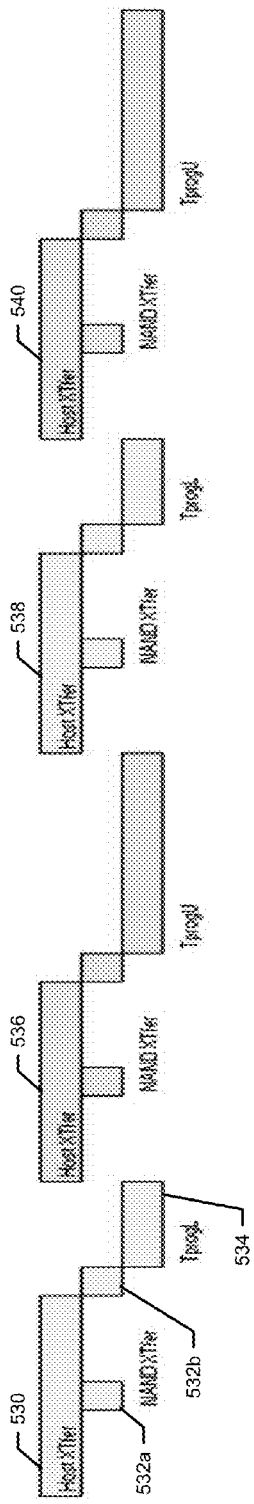
FIG. 5A shows a timing diagram for data transfer in a memory system that maintains a safe copy of data in a controller RAM.

FIG. 5A shows a timing diagram for a memory system that keeps a copy of all data in controller RAM until the data is confirmed as written. A first portion of data is transferred from the host. The first portion of data is transferred 530 to the memory chip in two chunks 532a, 532b which correspond to the two planes. In particular, in the present example, data for each plane is transferred from controller RAM as soon as it is received from the host. The first portion of data is transferred 532a, 532b to data latches in the on-chip cache. However, a copy of the first portion of data remains in controller RAM after transfer. Once the data for an entire page (in this case a metapage) has been transferred, the data is programmed 534 to the memory array. Only after the entire first portion of data has been confirmed as written does the host send a second portion of data 536. Normally, this occurs in response to a signal from the controller that indicates to the host that the first portion of data has been written. The second portion of data is then written in a similar manner, then the third portion of data is transferred 538, then the fourth portion of data 540, and so on. It will be noted that the example of FIG. 5 shows a longer program time ($T_{progU}$) for the second and fourth portions of data compared with the first and third portions of data ($T_{progL}$). This is because in the example shown, the first and third portions of data are written to lower pages, while the second and fourth portions of data are written to upper pages. In other examples, all data may be written as SLC data, or data may be written as more than two bits per cell.

In the example of FIG. 5A, operations are almost entirely sequential, with very little parallel operation. A first portion of data is transferred from a host 530, transferred to an on-chip cache (with only half 532a transferred in parallel with transfer of data from host), and then programmed to the nonvolatile memory array 534 before any operation is performed on the second portion of data. Similarly, all operations are performed on the second portion of data before any operations begin on the third portion of data. Also, in the example of FIG. 5A, all target data is maintained in controller RAM until it is confirmed as written to the nonvolatile memory. This may require a larger controller RAM than would otherwise be needed, which adds to cost.

Figure 5B:
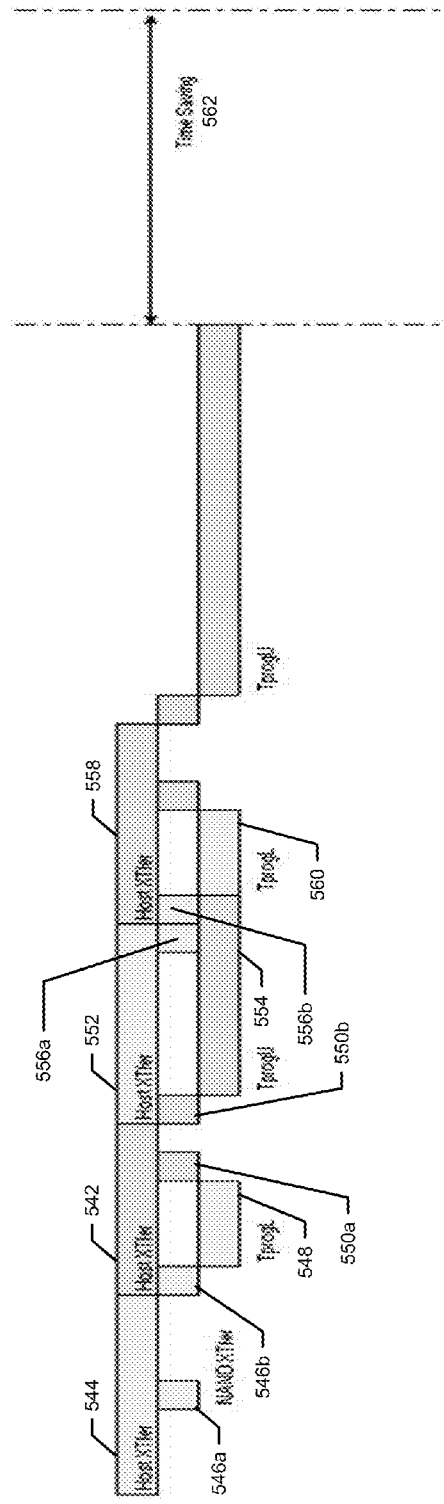
FIG. 5B shows a timing diagram for data transfer in another memory system that maintains a safe copy of lower page data in on-chip cache.

FIG. 5B shows an alternative scheme which provides more parallel operation than shown in FIG. 5A. First and third portions of data correspond to lower-pages, while second and fourth portions of data correspond to upper pages as in FIG. 5A. However, in FIG. 5B, instead of keeping a copy of all data until it is confirmed as written to the nonvolatile memory array, here a copy is kept in on-chip cache instead. This means that controller RAM does not have to keep a safe copy and is free to accept the next data as soon as the previous data is transferred to the on-chip cache. For example, the second portion of data begins transferring 542 from the host immediately after the first portion of data transfers 544, while the first portion of data is still being transferred to the on-chip cache 546b. Then, the second portion of data continues transferring 542 while the first portion of data is written 548 to the nonvolatile memory array. Once the first portion is confirmed as written to the memory array, the second portion of data starts to be transferred 550a from the controller RAM (transfer occurring in two chunks 550a, 550b corresponding to the two planes in this example). Immediately after the second portion of data has finished transferring 542 from the host, the third portion of data starts transferring 552 from the host. In parallel with transfer 552 of the third portion of data from the host, the second half of the second portion of data is transferred 550b from the controller RAM to the on-chip cache, and is then immediately programmed 554 to the nonvolatile memory array. While the second portion of data is being written 554 to the nonvolatile memory, the first half of the third portion of data is transferred 556a to the on-chip cache. Then, the fourth portion of data begins transferring 558 from the host to the controller RAM and in parallel, the second half of the third portion of data is transferred 556b to on-chip cache and is then written 560 to the nonvolatile memory array.

It should be noted that in the above example, a safe (backup) copy of all lower-page data is maintained in on-chip cache (this is in addition to a copy of the data that is used for writing, which is not recoverable if failure occurs). However, upper-page data is not maintained in on-chip cache in this way because there is not sufficient space in the on-chip cache (only two page buffers in the on-chip cache). Thus, transfer of the second portion of data (upper-page data) to the on-chip cache does not start until the entire first portion of data (lower-page data) is confirmed as complete because one page buffer is occupied by the safe copy of the first portion of data while the other page buffer is occupied by the target copy of the first portion of data. But transfer of the third portion of data (lower-page) takes place prior to completion of programming the second portion of data (upper page). This means that there is no safe copy of the second portion of data (in either controller RAM or in on-chip cache) at this point.

FIG. 5B shows the time saving 562 that may be obtained by using the technique of FIG. 5B as compared with that of FIG. 5A. By transferring new data from the host to the controller RAM before the data in controller RAM is confirmed as written to the nonvolatile memory, considerable time saving can be achieved. Keeping a safe copy of lower-page data allows recovery in case the portion of the memory array is defective. When such a defective region is identified, it is marked as a bad area (generally a bad page or bad block) and data for that area is mapped to a replacement area. If a bad area is identified during lower-page programming then the area is marked as bad and no attempt is made to program upper-page data there.

Figure 6C:
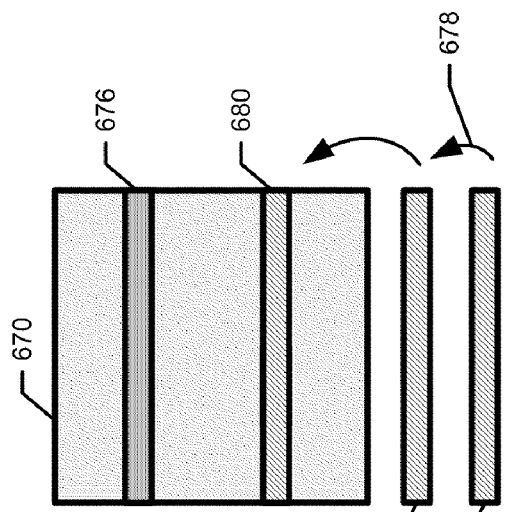
FIG. 6C shows copying of a safe copy of data of FIG. 6A, and writing to an alternative location in the memory array.
Figure 6B:
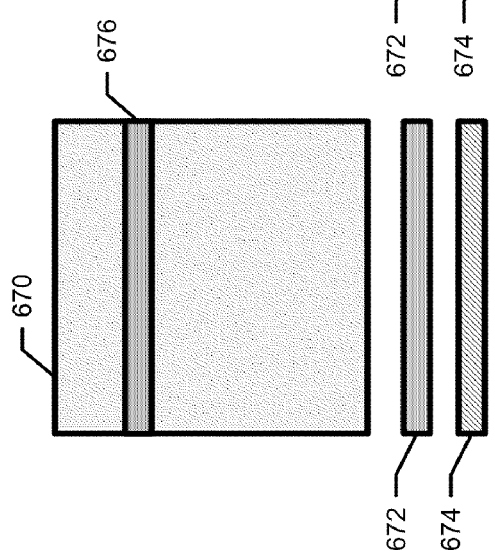
FIG. 6B shows failure of writing of data of FIG. 6A.
Figure 6A:
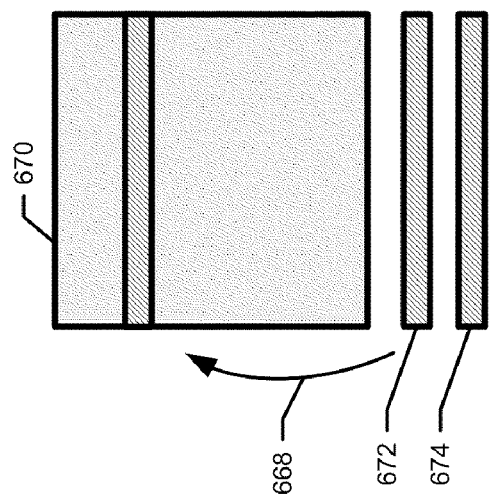
FIG. 6A shows writing of data in a memory array.

FIGS. 6A-C shows how the memory system such as that of FIG. 4 deals with a write failure. In particular, FIG. 6A shows data being written 668 to the nonvolatile memory array 670 from one page buffer 672 while another page buffer 674 holds a safe copy of the data (i.e. each data buffer holds a copy of the same data). The memory may be an SLC memory, or may be an MLC memory with the data being lower-page data. FIG. 6B shows that failure has occurred, and that data in the target area 676 of memory array 670 is unrecoverable, i.e. cells are in some intermediate states and not at their final target states so that the target data cannot be read from them. Also, the target data in page buffer 672 is unrecoverable because it was changed during program operation. However, in this example, a safe copy of the data is available in the second page buffer 674. FIG. 6C shows recovery by copying 678 the safe copy from page buffer 674 to the target page buffer 672, and then writing the target data to another location 680 in the memory array 670. The original target area 676 is then marked as a bad area so that it is not used again.

Figure 7:
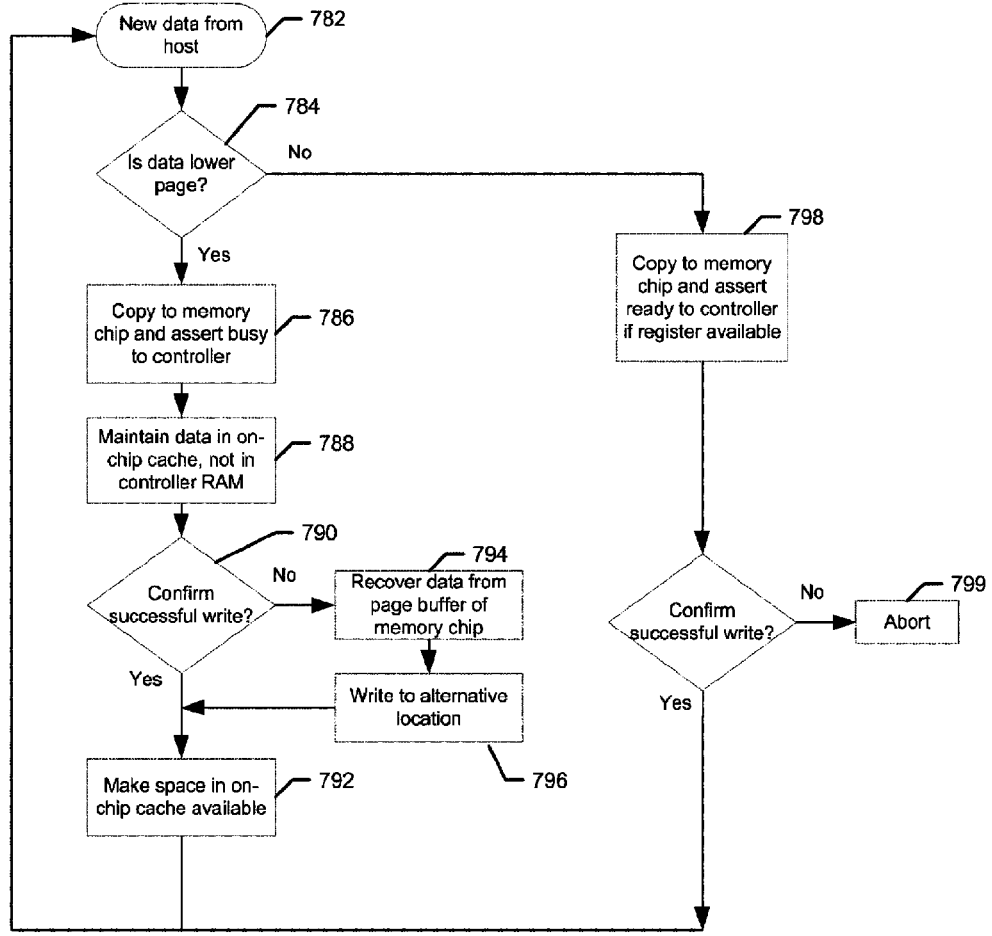
FIG. 7 shows a flowchart for a method of writing data that is received from a host.

FIG. 7 is a flowchart that shows a scheme for storing data according to an embodiment of the present invention. In particular, FIG. 7 shows that when new data is sent from the host 782, a determination is made as to whether the data is lower page data 784. In some memory arrays, all data is stored in SLC format and such data may all be considered as lower-page data for purposes of this example. In other memory arrays, data may be either upper-page or lower-page and a determination is first made as to which kind of data has been received. If the data is lower-page data, then the lower-page data is copied to the on-chip cache of the memory chip and a busy signal is asserted 786 by the memory chip to the controller which prevents the controller from sending additional data. The lower-page data is maintained in the on-chip cache 788 at this stage, but the lower-page data may be displaced from controller RAM by new data from the host. So a safe copy of the lower-page data may only be available from the on-chip cache if additional data displaces it from the controller RAM. The lower-page data is also copied to a data buffer that holds a target copy that is used for programming. When writing to the nonvolatile memory array is confirmed 790, more space is available in the on-chip cache 792 because the safe copy is no longer needed (a safe copy now exists in nonvolatile memory). If writing is not confirmed (if there is a write failure), then the safe copy is recovered from the page buffer in the on-chip cache of the memory chip 794 and this data is written to an alternative location 796. The alternative location may be in a dedicated physical area of the memory array, or the alternative location may be indicated by a logical address range that is mapped to different physical areas at different times. Such recovery and writing to the alternative location may occur without any separate command from the host. The memory controller may send the necessary commands to the memory array, without any command from the host to initiate the recovery. Thus, such an operation may occur without any involvement by the host.

If the data is upper-page data, then the data is copied to the memory chip and a ready signal may be asserted 798 to the controller to indicate that the on-chip cache is ready to accept additional data whenever there is a page buffer free. Generally, this occurs prior to completion of programming of the upper-page data so that additional data can be transferred from the controller to the on-chip cache prior to completion of programming of the upper-page data. If there is a write failure during writing of upper-page data then a write abort occurs 799. The host may be notified that a write failure has occurred so that the host knows that the memory does not contain a copy of the data that was sent. The host may resend the data, or may suspend saving of the data. In some cases, a safe copy of the data is available from controller RAM. While the present application is directed to storage of lower page data, co-pending patent application Ser. No. 12/485,846, entitled "Data recovery in multi-level cell nonvolatile memory" describes systems and methods for maintaining safe copies of upper and middle page data.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of recovering data to be written to a memory array that stores one or more bits per cell under the control of a memory controller, comprising:
    receiving a first portion of data from a host into a memory associated with the memory controller;
    sending the first portion of data from the memory associated with the memory controller to an on-chip cache that is on a same chip as the memory array, wherein the first portion of data is stored as a safe copy in a safe buffer of the on-chip buffer cache and stored as a target copy in a target buffer of the on-chip cache, wherein the target buffer is configured to write data that is received into such target buffer into the memory array;
    prior to confirming that the first portion of data is written to the memory array, sending a signal to the host indicating that the memory of the memory controller can receive more data and subsequently receiving a second portion of data from the host into the memory associated with the memory controller;
    maintaining the safe copy of the first data portion in the on-chip cache until writing of the first portion of data to the memory array is confirmed as successful; and
    when the writing of the first portion of data from the target buffer to the memory array is unsuccessful, then recovering the first portion of data from the safe copy in the on-chip cache and writing the first portion of data to an alternative location in the memory array.

2. The method of claim 1 wherein no copy of the first portion of data is maintained in the memory controller during the writing of the target copy of the first portion of data.

3. The method of claim 1 wherein the first portion of data is recovered from the on-chip cache and the first portion of data is written to the alternative location without a separate write command from a host.

4. The method of claim 1 wherein the first portion of data is recovered from the on-chip cache and the first portion of data is written to the alternative location in response to a command from the memory controller.

5. A method of managing data transfer from a host to a buffered non-volatile memory array that stores more than one bit per cell, comprising:
    copying a first portion of data from a memory of the memory controller to an on-chip cache on a same chip as the memory array, wherein the first portion of data is stored as a safe copy in a safe buffer of the on-chip buffer cache and stored as a target copy in a target buffer of the on-chip cache, wherein the target buffer is configured to write data that is received into such target buffer into the memory array;
    prior to confirming that the first portion of data is written to the memory array, sending a signal to the host indicating that the memory of the controller can receive more data and subsequently receiving a second portion of data from the host into the memory of the memory controller;
    writing the target copy of the first portion of data from the target buffer of the on-chip cache as lower-page data in the memory array while the second portion of data is being received from the host into the memory of the memory controller;
    in parallel with writing the target copy of the first portion of data, maintaining the safe copy of the first portion of data in the safe buffer of the on-chip cache;
    subsequently copying a target copy of the second portion of data from the memory of the memory controller to the on-chip cache, after writing the first portion of data;
    subsequently writing the target copy of the second portion of data from the on-chip cache as upper-page data in the memory array; and
    in parallel with writing the target copy of the second portion of data, maintaining a safe copy of the second portion of data in the memory controller.

6. The method of claim 5 wherein, during the writing of the first portion of data, a busy signal is provided to the memory controller to indicate that the non-volatile memory array is busy.

7. The method of claim 5 wherein the second portion of data is received as a replacement of the first portion of data in the memory of the memory controller.

8. The method of claim 5 wherein the first portion of data and the second portion of data are written to the same cells, with an individual cell containing one bit from the first portion of data and one bit from the second portion of data.

9. The method of claim 5 wherein the first portion of data is written to a first location in the memory array and further comprising, detecting if the writing of the first portion of data to the first location is successful or unsuccessful, and if unsuccessful then writing the first portion of data from the safe buffer of the on-chip cache to an alternative storage area.

10. The method of claim 9 wherein the first portion of data is written to the alternative storage area without being copied to the memory of the memory controller.

11. The method of claim 9 wherein writing the first portion of data from safe buffer of the on-chip cache to the alternative storage area includes copying the first portion of data from the on-chip cache to the memory controller and then copying the first portion of data to the alternative storage.

12. The method of claim 11 further comprising, prior to copying the first portion of data from the safe buffer of the on-chip cache to the memory of the memory controller, copying any data in memory of the memory controller to the memory array.

13. The method of claim 5 wherein the buffered non-volatile memory array and the memory controller are on a memory card that is connected to the host through a standard interface.

14. A memory system comprising:
    a memory controller having an associated memory;
    a non-volatile memory array; and
    an on-chip cache on a same chip as the non-volatile memory array and interposed between the memory controller and the non-volatile memory array, wherein the on-chip cache includes a safe buffer for storing a safe copy of the data and further includes a target buffer for storing a target copy of the data,
    wherein the memory controller is configured to:
        receive a first portion of data from a host into the memory associated with the controller;
        send the first portion of data from the memory associated with the controller to the on-chip cache, wherein the first portion of data is stored as a safe copy in the safe buffer of the on-chip buffer cache and stored as a target copy in the target buffer of the on-chip cache, wherein the target buffer is configured to write data that is received into such target buffer into the memory array;
        prior to confirming that the first portion of data is written to the memory array, send a signal to the host indicating that the memory of the controller can receive more data and subsequently receive a second portion of data from the host into the memory associated with the controller;

maintain bits to be written to the memory array only in the on-chip cache until such bits are confirmed as successfully written, and when bits are not successfully written, provide a copy of the bits for recovery from the on-chip cache.

15. The memory system of claim 14 wherein the bits to be written are lower-page bits, and the memory of the memory controller has insufficient capacity to store data to be written to a lower-page and store data to be written to an upper page at the same time.

16. The memory system of claim 14 wherein the memory controller is configured to receive new data that displaces lower-page data in the memory of the memory controller, after the lower-page data is copied to the on-chip cache, and before the lower-page data is written to the memory array.

17. The memory system of claim 14 wherein the memory controller is configured to maintain a busy signal and maintain upper-page data in the memory of the memory controller for the entire time period from the time the upper-page data is copied to the on-chip cache to the time the upper-page data is successfully written to the memory array.

* * * * *